United States Patent [19]

Reimann

[11] 4,312,897
[45] Jan. 26, 1982

[54] BURIED RESIST TECHNIQUE FOR THE FABRICATION OF PRINTED WIRING

[75] Inventor: William G. Reimann, Los Angeles, Calif.

[73] Assignee: Hughes Aircraft Company, Culver City, Calif.

[21] Appl. No.: 157,595

[22] Filed: Jun. 9, 1980

Related U.S. Application Data

[63] Continuation of Ser. No. 943,093, Sep. 18, 1978, abandoned.

[51] Int. Cl.³ .......................... H05K 3/42; H05K 3/18
[52] U.S. Cl. ....................................... 427/96; 156/664; 156/666; 156/901; 156/902; 427/97; 204/15; 430/318; 430/319
[58] Field of Search ...................... 204/15; 427/97, 96; 156/664, 666, 901, 902; 430/318, 319

[56] References Cited

U.S. PATENT DOCUMENTS

| | | | |
|---|---|---|---|
| 3,236,708 | 2/1966 | Tillis | 204/15 |
| 3,306,830 | 2/1967 | Bittrich et al. | 204/15 |
| 3,475,284 | 10/1969 | Olson | 204/15 |
| 3,673,680 | 7/1972 | Tanaka et al. | 204/15 |
| 3,986,939 | 10/1976 | Prest | 204/15 |
| 4,135,988 | 1/1979 | Dugan et al. | 427/97 |

Primary Examiner—John D. Smith
Attorney, Agent, or Firm—Lewis B. Sternfels; W. H. MacAllister

[57] ABSTRACT

Narrow conductors and narrow spaces therebetween, typically two or three mils wide, are fabricated on outer layers of a printed wiring board with built-up areas such as plated-through holes or conductors of widths greater than two or three mils. Gold is deposited over a copper clad substrate in a pattern defining the desired circuitry. Thereafter, solder is placed at the built-up areas and, using both the solder and the gold as resist or masks, the exposed copper is removed by etching. An organic resist material is used in lieu of solder when the built-up area comprises wide conductors or leads, e.g., power busses.

10 Claims, 25 Drawing Figures

BURIED RESIST TECHNIQUE FOR THE FABRICATION OF PRINTED WIRING

This is a continuation of application Ser. No. 943,093, filed Sept. 18, 1978, now abandoned.

BACKGROUND OF THE INVENTION

1. Field of the Invention

The present invention relates to a method for producing printed circuitry having built-up areas coexisting with narrow conductors or leads and/or narrow spacing between the conductors or leads.

2. Description of the Prior Art

The requirements for increasing the density of electric circuitry or to achieve a desired electrical characteristic, e.g., impedance, generally require that the conductors and the spacing between conductors become as narrow or small as possible. At the same time, it is also necessary to provide sufficient build-up of material for use in forming plated-through holes in two sided and multi-layer printed wiring boards and in developing thicker conductors, such as used as power busses. These two needs, that is, narrow conductors and thicker built-up areas, are difficult to obtain simultaneously.

In a first conventional process involving panel plating, copper is added to the entire outer surface of the printed wiring board; however, the thick plating obtained from panel plating makes it difficult to etch narrow conductors. The difficulty arises because, as the thickness of copper increases, the amount of undercutting resulting from the etching process increases. Therefore, for narrow conductors, the etching may cause sufficient undercutting as to leave too little attachment of the conductor to the substrate or to significantly remove sufficient lead material as to adversely affect the cross-section and electrical characteristics of the conductors.

In the method of pattern plating, copper is added to the conductor pattern which makes it difficult to maintain narrow spacing. For example, if a thin resist it utilized, the problem of plating overhang results, that is, plating builds up and over the resist at the edges of the resist, which also decreases the spacing between the conductors. The major problem is that the geometry cannot be controlled which, in general, leads to a lack of control of the electrical characteristics. Such uncontrolled geometry decreases spacing between conductors, increases the possibility of shorts between lines, decreases the amounts of voltage which can be carried because of the decreased insulation, makes it difficult to control the impedances between the lines, and increases capacitance between lines. A further problem results from an increase in failure due to the existence of organic contaminants which may be trapped under or between the lines, resulting, for example, in electrical leakage paths.

SUMMARY OF THE INVENTION

The present invention avoids or overcomes these and other problems by permitting conductors or leads to be greatly reduced in width while still maintaining reliable built-up areas. For example, conductor lines of five mils and less in width and spacing of five mils and less, typically two mil, are obtainable in printed circuit boards with plated-through holes.

Briefly, the printed circuitry having built-up areas and thin conductors is obtained by placing a conductive material in a pattern defining the circuitry over the dielectric substrate clad with conductive material. Further conductive material, which is different from the patterned conductive material, is placed over the first two conductive materials. A resist material, which may or may not be conductive, is then placed on the further conductive material in a pattern which defines the positions of the built-up areas. Using both the resist material and the pattern conductive material as protective layers or masks, portions of the cladding and further conductive material are removed.

It is, therefore, an object of the present invention to provide a technique for fabricating thin conductors and narrow spaces on printed wiring boards and relatively thicker built-up areas thereon.

Another object is to provide for such a technique in which conductor lines of five mil and smaller thicknesses are obtainable.

Another object is to provide for such a technique for obtaining five mil and less spacing between conductors.

Another object of such a technique is to provide for controlled electrical characteristics of etched conductors or leads.

Other aims and objects as well as a more complete understanding of the present invention will appear from the following explanation of exemplary embodiments and the accompanying drawings thereof.

BRIEF DESCRIPTION OF THE DRAWINGS

FIGS. 3 and 3a–3g illustrate the several steps in a third embodiment for obtaining both narrow as well as wide conductors.

DESCRIPTION OF THE PREFERRED EMBODIMENTS

Figure 1A:
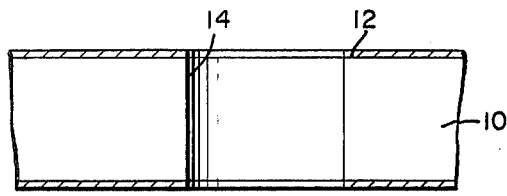
FIGS. 1a–1i depict several steps in carrying forth a first embodiment of the invention utilizing panel plating techniques.
Figure 1B:
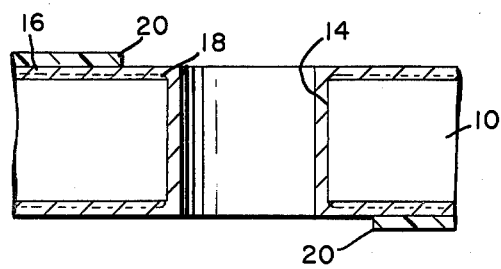

Stock used for forming printed wiring boards generally comprises a dielectric substrate having copper cladding thereon. Such stock is shown in FIG. 1a in which the dielectric substrate is denoted by indicum 10 and the cladding by indicum 12. One or more holes 14 are formed in the board where plated through holes are to be formed. Cladding 12 is preferably the thinnest copper foil that will satisfy electrical requirements, e.g. $\frac{1}{2}$, $\frac{1}{4}$ or $\frac{1}{8}$ oz. per square foot, which are equivalent to thicknesses of 0.8 mil, 0.4 mil and 0.2 mil. In order to make holes 14 conductive, a copper strike is deposited thereon in a thickness, for example, of 0.2 mil, and combines with foil 12 to become a thicker metallic coating which is generally denoted by indicium 16 in FIG. 1b. Because the copper strike and copper foil 12 are both of the same material, they are shown as a single layer 16 in FIG. 1b, with dashed line 18 denoting the upper surface of copper foil 12. Because the two are of the same material, in subsequent FIGS. 1c–1i deliniation line 18 will not be further shown. Placement of the copper strike may be made by any convenient technique such as by vapor or electroless deposition.

Thereafter, a pattern of photoresist material 20 is formed on copper layer 16 by well known masking, photo exposure, developing and removal techniques. The photoresist pattern defines the required fine conductor width and spacing.

Figure 1C:
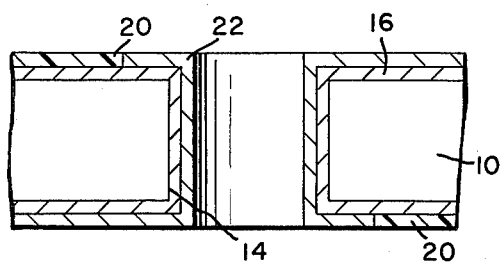
Figure 1D:
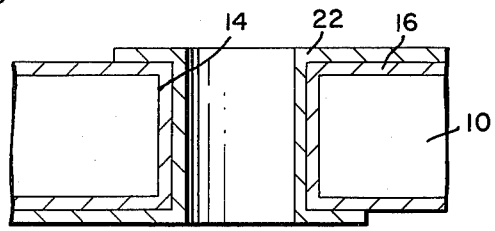
Figure 1E:
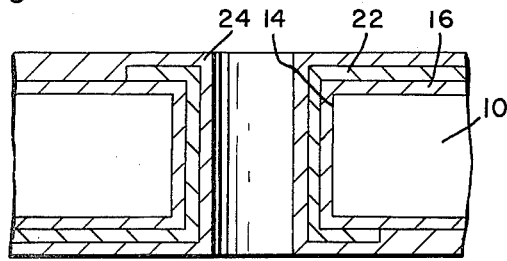

The image exposed through photoresist pattern 20 is then electroplated with a metallic resist 22, for example, gold, as shown in FIG. 1c to a thickness typically of 30–50 millionths of an inch. Resist pattern 20 is then removed as shown in FIG. 1d and, as illustrated in FIG. 1e, a further copper layer 24 is panel plated such as by electroplating over the respective copper and gold deposits 16 and 22.

Figure 1F:
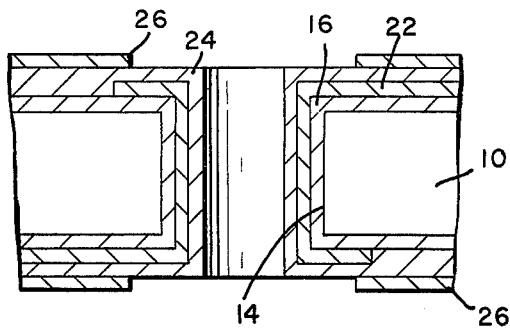
Figure 1G:
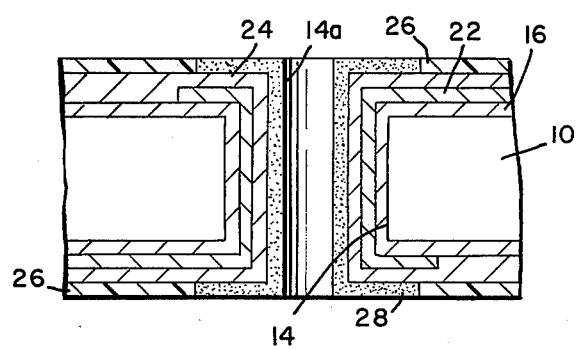

A further pattern of photoresist 26 is placed over the entire printed wiring board except at and adjacent to holes 14, as shown in FIG. 1f. Following the placement of photoresist pattern 26, solder 28 is deposited in and adjacent to holes 14, as depicted in FIG. 1g.

Figure 1H:
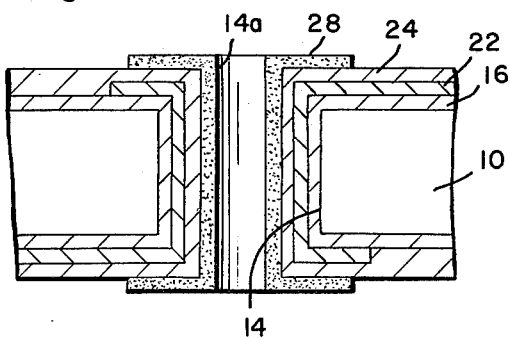
Figure 1I:
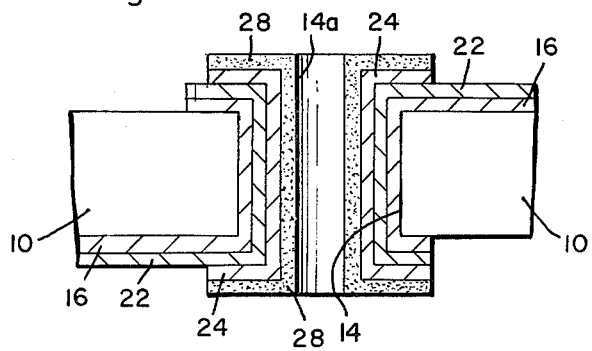

Resist 26 is then removed as illustrated in FIG. 1h and, using solder deposits 28 and gold deposits 22 as masks, any exposed copper from layers 16 and 22 is removed by an etchant, thereby leaving the desired finished product depicted in FIG. 1i having thin conductors comprising an underlayer 16 of copper and an overlayer 22 of gold at all holes 14 and throughout the surface of the printed wiring board. Built-up areas further include the remnants of copper panel plate 24 and solder 28.

Figure 2A:
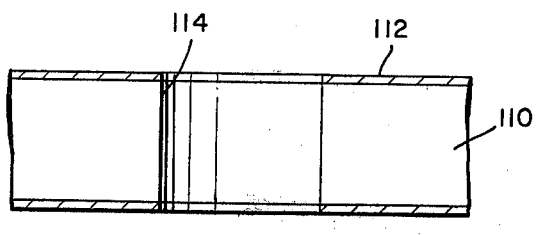
FIGS. 2a–2h depict several steps in carrying forth a second embodiment utilizing a pattern plating technique.
Figure 2B:
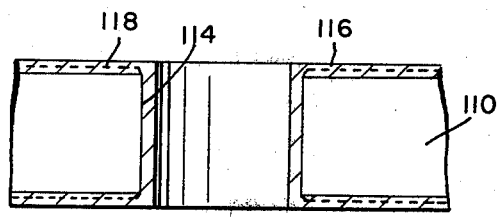
Figure 2C:
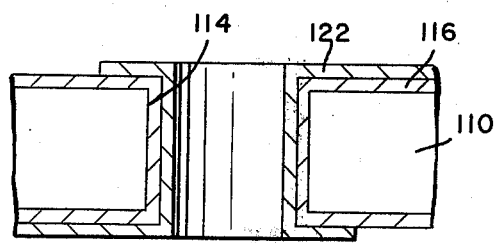
Figure 2D:
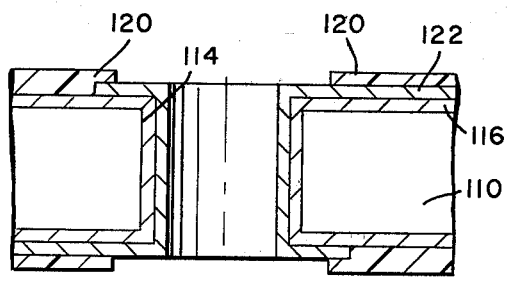
Figure 2E:
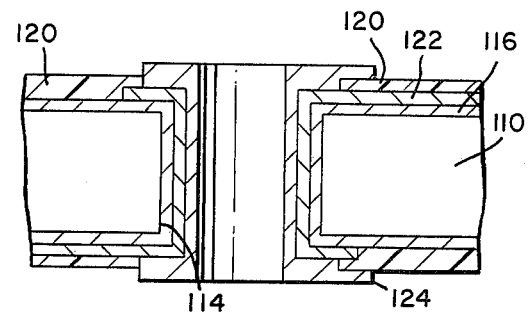
Figure 2F:
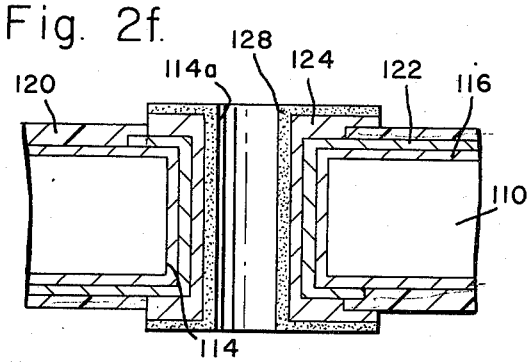
Figure 2G:
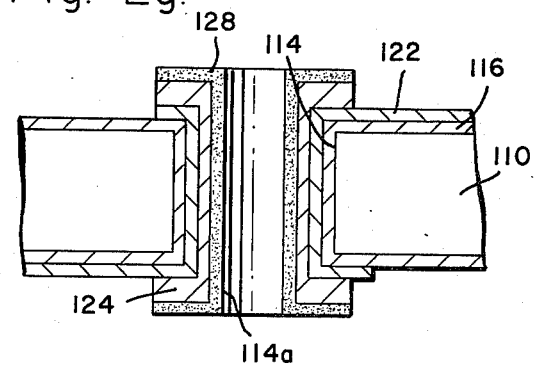
Figure 2H:
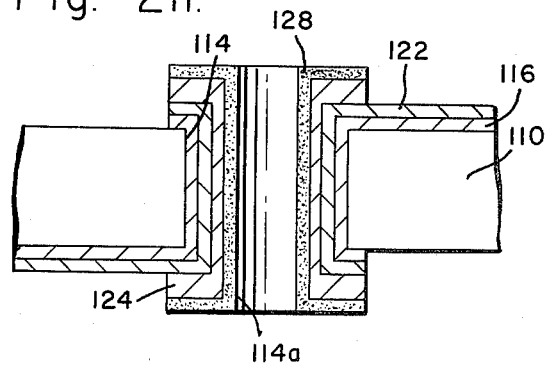

In the pattern plating technique depicted in FIGS. 2a–2h, layers similar to those shown in the previous figures have the same last two numerals. The starting point, as before, is a dielectric substrate 110 clad with copper foil 112. Holes 114 are drilled through the stock wherever printed-through holes are to appear. As shown in FIG. 2b, further copper material, as a strike, is deposited over layer 112 and into hole 114, the combined copper layers being denoted by indicium 116. The upper surface of the former copper foil is denoted by indicium 118. To this point, the process is similar as that previously described. As shown in FIG. 2c, gold pads and conductors 122 are placed over copper layer 116 and deliniated as such by conventional masking and etching techniques. Thereafter, as shown in FIG. 2d, a pattern of photoresist material 120 is selectively placed over the printed wiring board except at and adjacent to holes 114. Copper 124 (FIG. 2e) is then electroplated in the pattern defined by resist 120 onto exposed metal portions of the entire circuit, in particular, at holes 114. Solder 128 (FIG. 2f) is then placed atop copper 124. Resist 120 is then removed, as shown in FIG. 2g. Using both solder deposit 128 and gold deposit 122 as etch-resistant masks, any exposed copper from layers 116 and 124 is removed to define the finished product as shown in FIG. 2h.

Figure 3:
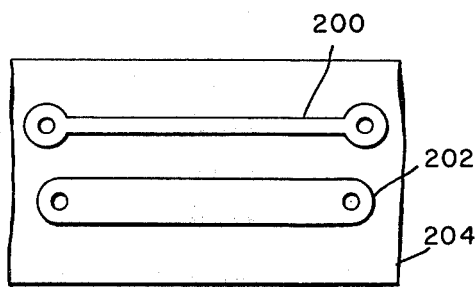
Figure 3:
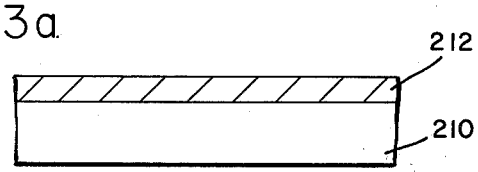
Figure 3:
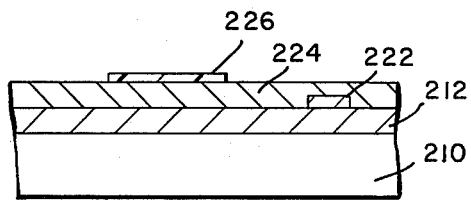
Figure 3:
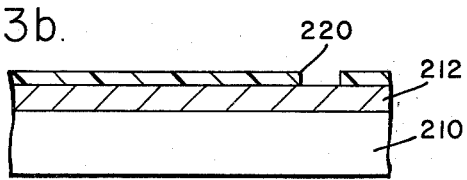
Figure 3:
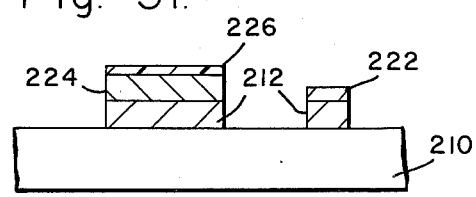
Figure 3:
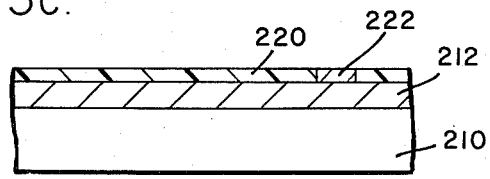
Figure 3:
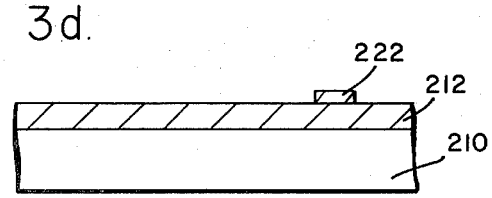
Figure 3:
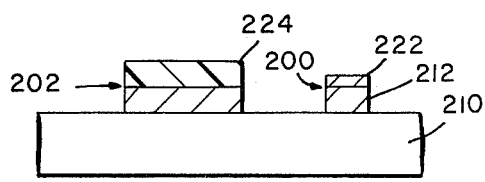

To obtain thick and thin conductors, the reader's attention is directed to FIGS. 3 and 3a–3g. FIG. 3 illustrates a narrow and thin conductor 200 and a relatively wider and thicker conductor 202 on a printed wiring board, a portion of which is denoted by indicium 204. These conductors are formed in the manner illustrated in FIGS. 3a–3g. As before, a dielectric substrate 210 is used having copper foil 212 (e.g., of 0.8 mil thickness) thereon. A photoresist pattern 220 is formed on copper layer 212 (FIG. 3b) and 30–50 millionths of an inch gold 222 is deposited in the openings within photoresist pattern 220 (FIG. 3c). The resist is then removed (FIG. 3d) and a second copper layer 224 (e.g., of 0.8 mil thickness) is plated over both copper layer 212 and gold deposits 222 (FIG. 3e). A photoresist pattern 226 is then placed over copper layer 224 where thick conductors 202 are to be formed, also shown in FIG. 3e. Both photoresist pattern 226 and gold deposit 222 are then used as etch resistant masks so that exposed copper in both copper layers 212 and 224 is removed, as shown in FIG. 3f. Finally, the photoresist material is removed resulting in the finished product depicted in FIGS. 3g and 3.

In all of the above embodiments, gold is preferably typically deposited in thicknesses of 30–50 millionths of an inch. It need not be deposited in holes 14. The thickness is not critical; only the least amount is desired so as to decrease the costs therof. It is only necessary to have a sufficient thickness as to permit it to act as a resist. As stated above, the thickness of copper foil 12, 112 and 212 may be as small as possible, e.g. ⅛ oz. per square foot (about 0.2 mil in thickness, and the copper strikes may be of a like dimension. The solder plate is typically 0.3 mils in thickness. For a combined copper thickness of about 0.9 mils, for example, etching creates an undercut about 1 mil to reduce a 3 mil wide conductor to a width of about 2 mils. Therefore, it is possible to tailor the thicknesses of the final conductors to better than that obtained in the prior art. In the last examples depicted in FIGS. 3 and 3a–3g, a typical width of conductors 200 is 2 mil, comprising ½ oz. per square foot of copper, and a thickness of conductors 202 is about 10 mil, reflecting a thickness of about 1 oz. of copper.

While both copper and gold have been described above as the preferred materials, any suitable materials or resists may be used. Therefore, instead of gold, any metals such as tin, nickel and solder which are not readily attacked by an etchant may be used. Instead of copper, Inconel and stainless steel, for example, may be used.

Although the invention has been described with reference to particular embodiments thereof, it should be realized that various changes and modifications may be made therein without departing from the spirit and scope of the invention.

What is claimed is:

1. A method for producing printed circuitry having built-up areas and thin conductors comprising the steps of:
    placing a mask of a first conductive material in a pattern defining the circuitry and the thin conductors on a conductive coating covering a dielectric substrate;
    placing further conductive material different from the first conductive material over the conductive coating and the first conductive material;
    placing a mask of a resist material on the further conductive material in a pattern defining the positions of the built-up areas; and
    removing portions of the conductive coating and the further conductive material not covered respectively by the masks of the first conductive and the resist materials.

2. A method according to claim 1 further comprising the step of removing the resist material after said removing step.

3. A method according to claim 2 further comprising the steps of configuring the resist material with a greater width than that of the first conductive material for defining the built-up areas as conductors which are comparatively thicker than the thin conductors.

4. A method according to claim 1 wherein the coating and the further conductive material consist of the same composition.

5. A method according to claim 1 wherein the resist material comprises an electrically conductive material.

6. A method according to claim 1 wherein the coating and the further conductive material comprise copper and the resist material comprises solder.

7. A method according to claim 6 further comprising the step of forming feed-through holes through at least the substrate at the positions of the built-up areas with at least the copper and the solder extending through the holes.

8. A method of fabricating etched circuitry comprising, in combination, the steps of:
- forming a plurality of holes, defining locations of electrical connections, through a sheet of dielectric material having an electrically conductive cladding thereon;
- plating a first film of a first electrically conductive material onto each side of the sheet and on annular surfaces of the holes;
- coating the plated sheet with a decalcomanic mask defining a pattern of relatively narrow strips of the circuitry to be fabricated;
- further plating the masked sheet with a second film comprising a second conductive material;
- removing the decalcomanic mask;
- further plating the sheet with a third film comprising the first conductive material until a desired thickness of the third film is achieved in the holes extending between the sides of the sheet;
- coating the sheet with a second decalcomanic mask such that the plated-through holes and the annular surfaces adjacent thereto are exposed;
- further plating the exposed plated-through holes and adjacent surfaces with a third film of a third conductive material;
- removing the second decalomanic mask; and
- etching portions of the sheet by utilizing a solution capable of etching the first material but not the second and third conductive materials, whereby an etched pattern of the relatively narrow strips of conductive material defining the circuitry is left on the surface of the dielectric material and in the holes.

9. A method of fabricating circuitry having an etched pattern of strips of conductive material thereon comprising, in combination, the steps of:
- forming a plurality of holes through a sheet of dielectric material having a first conductive material thereon;
- plating the sheet and the holes with a second conductive material;
- coating the sheet with a decalcomanic pattern such that walls of the holes and the annular surfaces surrounding the holes on the surface of the sheet form exposed portions;
- further plating the sheet with the first conductive material until a desired thickness is achieved in the holes;
- further plating the exposed portions of the sheet with a third conductive material;
- removing the decalcomanic pattern; and
- exposing the sheet to an etching solution, the second and third conductive material acting as a resist to the effect of the etching solution, to remove portions of the sheet in areas not covered by the second and third conductive materials, whereby the etched pattern of strips of conductive material is left on the surface of the dielectric material and on the walls of the holes.

10. A method of fabricating etched circuitry such that the circuitry has larger and smaller widths comprising the steps of:
- plating relatively thin sheets of a first conductive material to each side of a sheet of dielectric material;
- coating the plated sheet with a decalcomanic pattern such that the pattern exposes the sheet over an area where the smaller width circuitry will be created;
- further plating the sheet with a second conductive material, thereby producing the smaller width circuitry;
- removing the decalcomanic pattern;
- further plating the sheet with the first conductive material until a desired thickness is achieved;
- coating the sheet with a second decalcomanic pattern defining an area where the larger width circuitry will be etched;
- exposing the sheet to an etching solution, in which the second conductive material and the second decalcomanic pattern serve as a resist to the effect of the etching solution, the etching solution thereby removing the portions of the sheets in the areas not covered by the second conductive material and the second decalcomanic pattern, whereby an etched pattern of the relatively larger and smaller widths of the conductive material is left on the surface of the dielectric material; and
- removing the second decalcomanic pattern.

* * * * *